United States Patent [19]
Walker et al.

[11] Patent Number: 5,578,826
[45] Date of Patent: Nov. 26, 1996

[54] THERMAL ISOLATION FOR HYBRID THERMAL DETECTORS

[75] Inventors: William K. Walker, Plano; John P. Long, Garland; Robert A. Owen, Rowlett; Bert T. Runnels, Garland; Gail D. Shelton, Mesquite, all of Tex.

[73] Assignee: Texas Instruments Incorporated, Dallas, Tex.

[21] Appl. No.: 468,159

[22] Filed: Jun. 6, 1995

Related U.S. Application Data

[63] Continuation of Ser. No. 268,365, Jun. 30, 1994.

[51] Int. Cl.⁶ ................................................. G01J 5/10
[52] U.S. Cl. ......................................... 250/338.3; 250/332
[58] Field of Search ............................ 250/338.3, 332

[56] References Cited

U.S. PATENT DOCUMENTS

| | | | |
|---|---|---|---|
| 3,676,455 | 7/1972 | Haug et al. | 260/309.5 |
| 3,846,820 | 11/1974 | Lampe et al. | 357/31 |
| 4,018,608 | 4/1977 | Frazier | 96/27 |
| 4,080,532 | 3/1978 | Hopper | 250/332 |
| 4,142,207 | 2/1979 | McCormack et al. | 358/113 |
| 4,143,269 | 3/1979 | McCormack et al. | 250/352 |
| 4,162,402 | 7/1979 | Hopper | 250/332 |
| 4,205,227 | 5/1980 | Reed | 250/330 |
| 4,275,302 | 6/1981 | Imbert et al. | 250/330 |
| 4,354,109 | 10/1982 | Gelpey et al. | 250/349 |
| 4,379,232 | 4/1983 | Hopper | 250/332 |
| 4,594,507 | 6/1986 | Elliott et al. | 250/331 |
| 4,705,361 | 11/1987 | Frazier et al. | 350/355 |
| 4,740,700 | 4/1988 | Shaham et al. | 250/332 |
| 4,751,387 | 6/1988 | Robillard | 250/331 |
| 4,994,672 | 2/1991 | Cross et al. | 250/330 |
| 5,010,251 | 4/1991 | Grinberg et al. | 250/332 |
| 5,015,858 | 5/1991 | Augustine et al. | 250/352 |
| 5,021,663 | 6/1991 | Hornbeck | 250/349 |
| 5,047,644 | 9/1991 | Meissner et al. | 250/332 |
| 5,051,591 | 9/1991 | Trotta et al. | 250/351 |
| 5,196,703 | 3/1993 | Keenan | 250/332 |
| 5,238,530 | 8/1993 | Douglas et al. | 156/635 |
| 5,264,326 | 11/1993 | Meissner et al. | 430/313 |
| 5,426,304 | 6/1995 | Belcher et al. | 250/332 |

FOREIGN PATENT DOCUMENTS

| | | |
|---|---|---|
| 939943 | 1/1974 | Canada . |
| 197806 | 11/1976 | Germany . |
| 2251952 | 7/1992 | United Kingdom . |
| WO91/16607 | 10/1991 | WIPO . |

OTHER PUBLICATIONS

R. A. Wood, "HID AD–A Monolithic, Silicon, Uncooled Infrared Imaging Focal Plane Array", HIDAD, 16.5, pp. 579–581 place of publication?.

*Primary Examiner*—Constantine Hannaher
*Attorney, Agent, or Firm*—Brian Carlson; Richard Stoltz; Richard Donaldson

[57] ABSTRACT

A hybrid thermal detector (10, 110) includes a focal plane array (20, 120), a thermal isolation structure (40, 140), and an integrated circuit substrate (60, 160). The focal plane array (20, 120) includes thermal sensors (30, 130). The thermal isolation structure (40, 140) includes untrimmed mesa-type formations (44, 146, 148) and mesa strip conductors (42, 142, 144) that provide thermal isolation, signal transport, and structural support of the focal plane array (20, 120) when mounted on the integrated circuit substrate (60, 160). Hybrid thermal detector (10) includes a common electrode (28) which provides a bias voltage to all thermal sensors (30). Hybrid thermal detector (110) has electrically isolated thermal sensors (130), each thermal sensor (130) is supported by mesa strip conductors (142, 144), which provide a bias voltage to and receive a signal voltage from the thermal sensor (130). To improve both pixel-substrate and inter-pixel thermal isolation, mesa strip conductors (42, 142, 144) and common electrode (28) may be formed from a thermally insulating material, such as cermet or a semiconductive material. Untrimmed mesa-type formations (44, 146, 148) may be anisotropically etched to remove excess mesa material and improve pixel-substrate thermal isolation.

8 Claims, 3 Drawing Sheets

THERMAL ISOLATION FOR HYBRID THERMAL DETECTORS

RELATED APPLICATIONS

This application is a continuation application of U.S. application Ser. No. 08/268,365, filed Jun. 30, 1994 and entitled "Thermal Isolation for Hybrid Thermal Detectors," by William K. Walker, John P. Long, Robert A. Owen, Bert T. Runnels and Gail D. Shelton, now pending.

This application is related to copending application Ser. No. 08/235,835, entitled Inter-Pixel Thermal Isolation for Hybrid Thermal Detectors, issued on Jun. 13, 1995 as U.S. Pat. No. 5,424,544, copending application Ser. No. 08/235,068, entitled Thermal Isolation Structure for Hybrid Thermal Detectors, issued on Jun. 20, 1995 as U.S. Pat. No. 5,426,303, copending application Ser. No. 08/236,778, entitled Thermal Isolation of Hybrid Thermal Detectors Through an Anisotropic Etch, issued on Dec. 26, 1995 as U.S. Pat. No. 5,478,242, and copending application Ser. No. 08/182,868, entitled Thermal Isolation Structure for Hybrid Thermal Imaging System, issued on Jan. 16, 1996 as U.S. Pat. No 5,485,010, all applications of the same assignee.

TECHNICAL FIELD OF THE INVENTION

This invention relates to thermal isolation of hybrid solid state systems, and more particularly to hybrid thermal detectors and methods of fabrication.

BACKGROUND OF THE INVENTION

One common application for thermal sensors is in thermal (infrared) detection devices such as night vision equipment. One such class of thermal detection devices includes a focal plane array of infrared detector elements or thermal sensors coupled to a substrate with a corresponding plurality of contact pads between the focal plane array and the substrate. The thermal sensors define the respective picture elements or pixels of the resulting thermal image.

One type of thermal sensor includes a pyroelectric element formed from a pyroelectric material that exhibits a state of electrical polarization dependent upon temperature changes in response to thermal radiation. Barium strontium titanate (BST) is one example of such pyroelectric material. In one embodiment, an infrared absorber and common electrode assembly is disposed on one side of the pyroelectric elements. A sensor signal electrode is disposed on the opposite side of each pyroelectric element. The infrared absorber and common electrode assembly extends across the surface of the focal plane array and is coupled to each of the pyroelectric elements. Each pyroelectric element has its own separate sensor signal electrode. Each infrared detector element or thermal sensor is defined, in part, by the infrared absorber and common electrode assembly and a respective sensor signal electrode, which constitute capacitive plates, and a respective pyroelectric element, which constitutes a dielectric disposed between the capacitive plates.

To maximize thermal response and enhance thermal image accuracy, each pyroelectric element of the focal plane array is preferably isolated thermally from the associated substrate and from adjacent pyroelectric elements to ensure that the sensor signal from each thermal sensor accurately represents incident infrared radiation. Several approaches have been used to enhance both pixel-substrate thermal isolation between the thermal sensors and an underlying substrate and inter-pixel thermal isolation between adjacent pyroelectric elements.

SUMMARY OF THE INVENTION

In accordance with the present invention, the disadvantages and problems associated with previous thermal isolation structures used to couple, both mechanically and electrically, component structures of a hybrid thermal detection system have been substantially reduced or eliminated. The present invention may improve both pixel-substrate and inter-pixel thermal isolation by forming mesa strip conductors and/or the common electrode from thermally insulating material, such as cermet or a semiconductive material, and/or by removing through an anisotropic etch excess mesa material used to form portions of the thermal isolation structure.

In one aspect of the present invention, a hybrid thermal detector includes thermal sensors for generating a sensor signal output representative of the thermal radiation incident to the respective thermal sensor. Each thermal sensor includes an associated pyroelectric element. A substrate may be provided with signal contact pads for receiving the sensor signal outputs from the respective thermal sensors. Mesa-type formations projecting from the substrate adjacent to the signal contact pads may be provided to form a portion of the thermal isolation structure. Mesa strip conductors are preferably disposed between the thermal sensors and the substrate and extend from the top of an associated mesa-type formation to a corresponding signal contact pad on the substrate. The mesa strip conductors may be formed from a single film of thermally insulating material. The thermal sensors are generally disposed over the substrate such that the sensor signal output for each thermal sensor may be coupled with the corresponding signal contact pad by the respective mesa strip conductor.

In accordance with another aspect of the present invention, a hybrid thermal detector includes thermal sensors for generating a sensor signal output representative of the thermal radiation incident to the respective thermal sensor. Each thermal sensor includes an associated pyroelectric element. A common electrode may be formed from a thermally insulating material and coupled to the respective pyroelectric elements associated with the thermal sensors to supply a selected potential to the pyroelectric elements. An infrared absorber layer sensitive to infrared radiation may be coupled to the common electrode. A substrate includes signal contact pads for receiving the sensor signal outputs from the respective thermal sensors. Mesa-type formations project adjacent to the signal contact pads of the substrate. Mesa strip conductors are disposed between the thermal sensors and the substrate and extend from the top of an associated mesa-type formation to a corresponding signal contact pad of the substrate. The mesa strip conductors are formed from a single film of thermally insulating material. Thermal sensors are disposed over the substrate such that the sensor signal output for each thermal sensor is coupled with the corresponding signal contact pad by the respective mesa strip conductor.

In accordance with another aspect of the present invention, a method of fabricating a hybrid thermal detector forms a focal plane array from thermal sensors which provide a sensor signal output representative of thermal radiation incident to the focal plane array. Each thermal sensor is formed in part from an associated pyroelectric element. A substrate is provided with signal contact pads for receiving the sensor signal output from the respective thermal sensors. Mesa-type formations are formed to project from the substrate adjacent to the signal contact pads. Mesa strip conductors are formed from a single film of thermally insulating material and extend from the top of an associated mesa-type formation to a corresponding signal contact pad. The focal plane array is coupled with the substrate using the mesa strip conductors.

Important technical advantages of the present invention can include improving pixel-substrate thermal isolation by forming the mesa strip conductors from a thermally insulating material. In one embodiment, the mesa strip conductors may be formed from a cermet or a semiconductive material that offers adequate electrical conductivity, while enhancing thermal isolation between the focal plane array and the substrate.

Other important technical advantages of the present invention can include minimizing pixel-substrate thermal conductivity while improving overall mechanical and electrical integrity. A mesa strip conductor formed from thermally insulating material may be thicker than an electrically conductive film and still offer improved thermal isolation. Consequently, a thicker mesa strip conductor improves structural integrity and reduces the occurrences of electrical discontinuities without sacrificing thermal isolation.

Other important technical advantages of the present invention can include forming the common electrode of the infrared absorber and common electrode assembly out of a thermally insulating material to improve inter-pixel thermal isolation. Current thermal detection systems may use an electrically and thermally conductive material, such as nichrome (NiCr), to form the common electrode. The present invention can include using a thermally insulating material, such as cermet or a semiconductive material, that provides adequate electrical conductivity to deliver a potential to each thermal sensor while substantially improving inter-pixel thermal isolation.

Other important technical advantages of the present invention can include enhancing pixel-substrate thermal isolation between the focal plane array and the underlying substrate by removing excess material used to form the mesa-type formations. In one embodiment, an anisotropic etch uses a mesa strip conductor formed on the mesa-type formation as a mask to remove mesa material not directly beneath the mesa strip conductor. The resulting mesa-type formation is defined substantially by the vertical projections of the mesa strip conductor on the substrate. In another embodiment, bump-bonding material may be placed on the mesa strip conductor and also used as a mask during the anisotropic etch.

BRIEF DESCRIPTION OF THE DRAWINGS

For a more complete understanding of the present invention, and for further features and advantages, reference is now made to the following description, taken in conjunction with the accompanying drawings, in which.

DETAILED DESCRIPTION OF THE INVENTION

Figure 1:
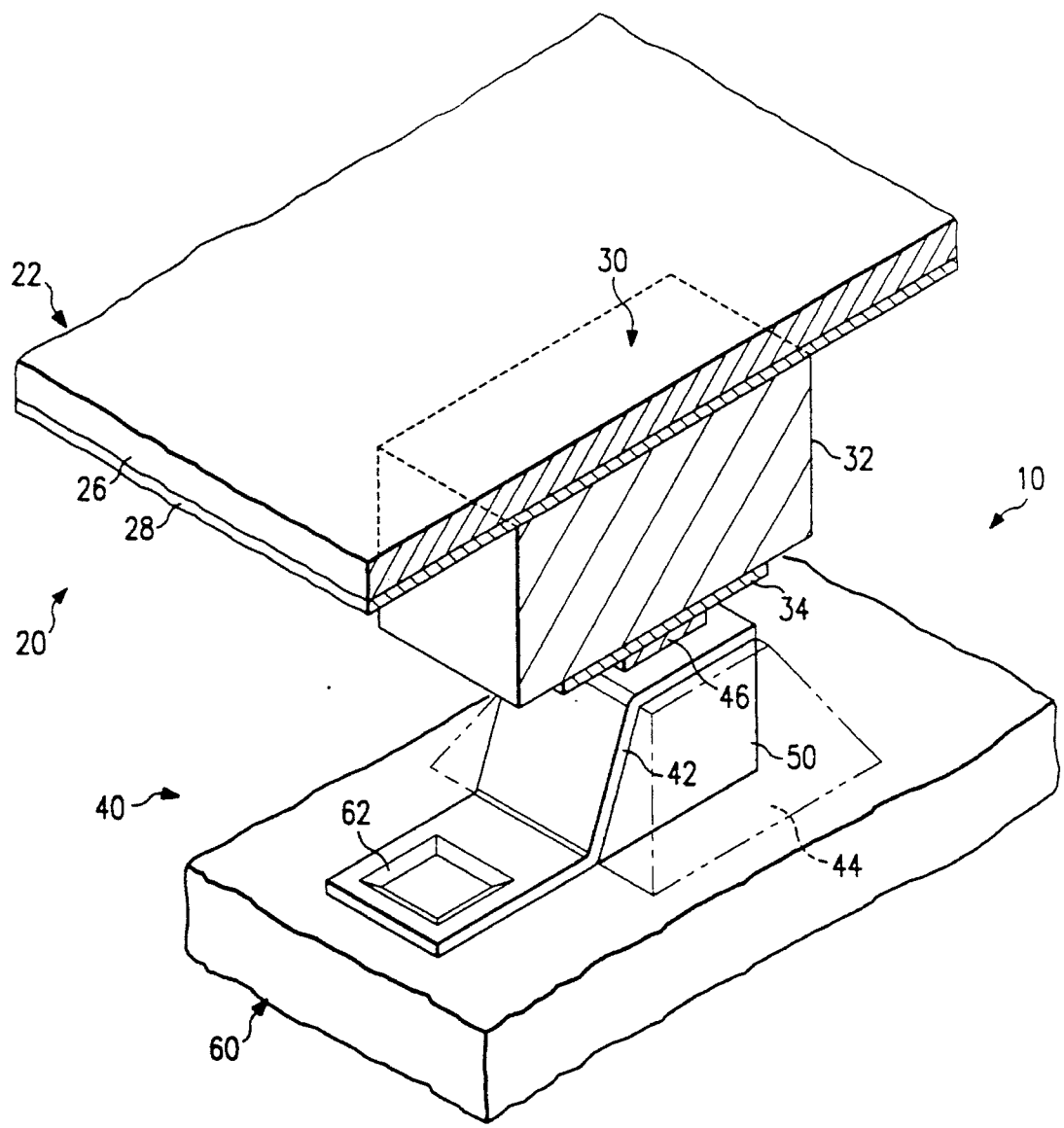
FIG. 1 is an isometric drawing with portions broken away showing a hybrid thermal detector having a trimmed mesa-type formation supporting a mesa strip conductor formed from thermally insulating material to improve pixel-substrate thermal isolation.
Figure 2:
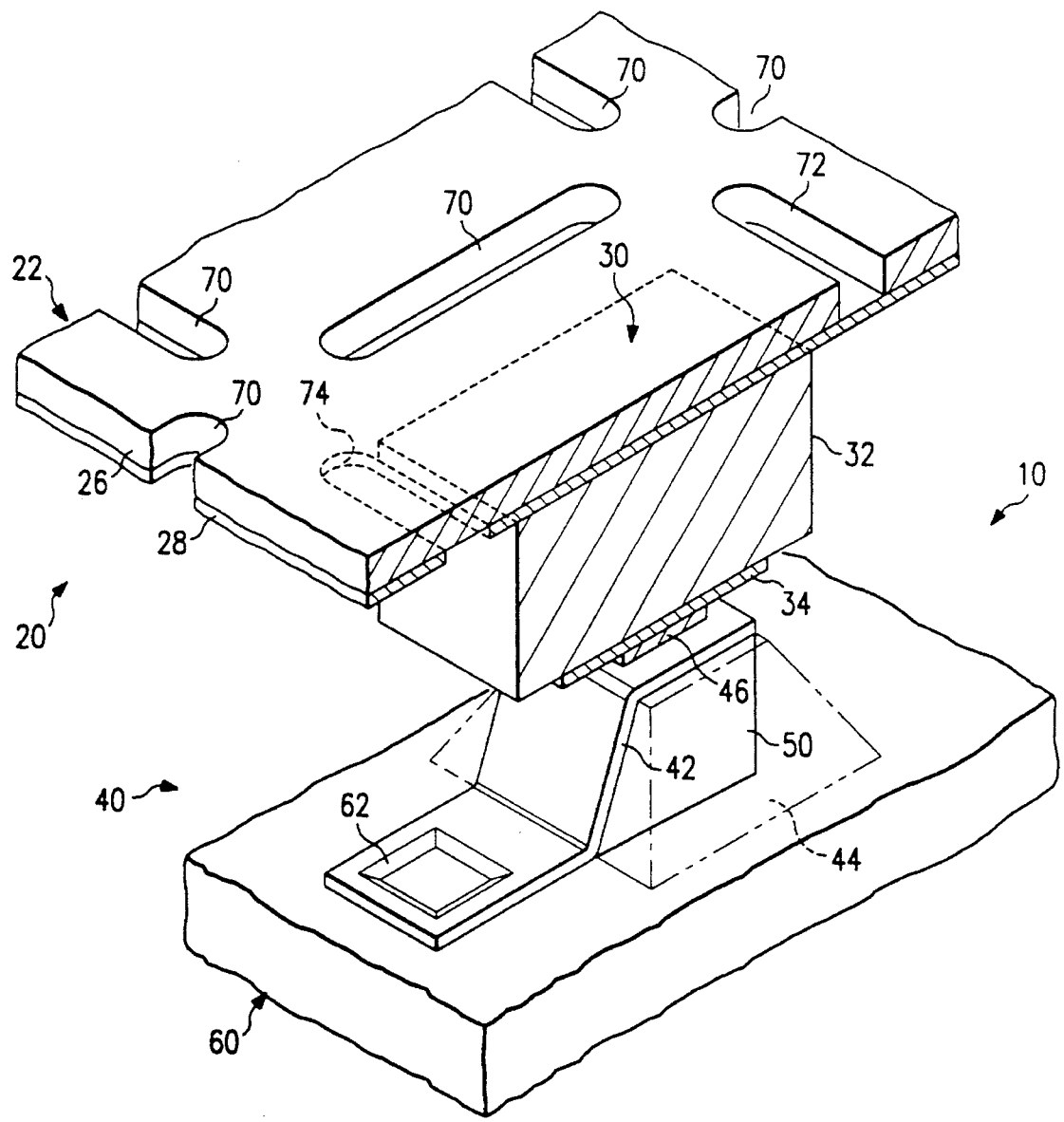
FIG. 2 is an isometric drawing with portions broken away showing the hybrid thermal detector of FIG. 1 and further providing slots in the focal plane array to improve inter-pixel thermal isolation.
Figure 3:
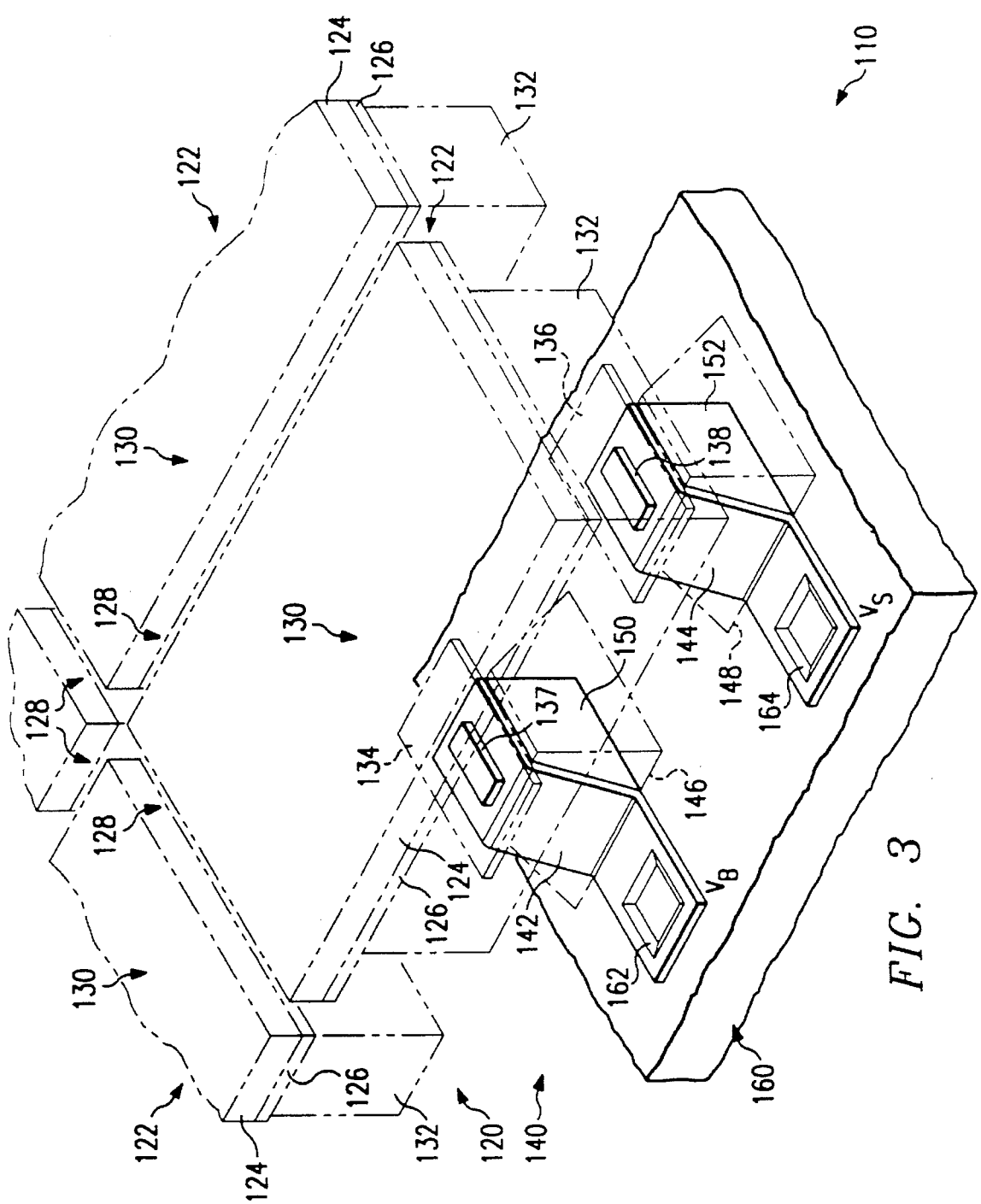
FIG. 3 is an isometric drawing with portions broken away showing a pair of thermal isolation structures for thermally isolating and structurally supporting a thermal sensor, shown in phantom lines, and for electrically coupling the thermal sensor to associated contact pads on an integrated circuit substrate.

The preferred embodiments of the present invention and its advantages are best understood by referring to FIGS. 1 through 3 of the drawings, like numerals being used for like and corresponding parts of the various drawings.

Infrared detectors are typically based upon either the generation of a change in voltage or current due to a change in temperature resulting from incident infrared radiation striking the detector or the generation of a change in voltage or current due to a photon-electron interaction within the material used to form the detector. This latter effect is sometimes called the internal photo-electric effect, and detectors using this phenomenon are called photon detectors. Detectors that make use of temperature dependent properties are called thermal detectors. Some thermal detectors are based upon a change in resistance or capacitance of a thin conductor caused by the heating effect of incident infrared radiation. Such thermal detectors are sometimes referred to as bolometers.

Hybrid thermal detectors 10 and 110, which will be described later and in more detail, function based upon the generation of a change in voltage or current due to a change in temperature of pyroelectric material resulting from incident infrared radiation. However, the present invention may be used with other types of thermal detectors including bolometers.

Some infrared detectors are hybrid solid state systems formed by mounting a focal plane array on a substrate, such as an integrated circuit substrate, with a thermal isolation structure disposed therebetween to enhance pixel-substrate thermal isolation. Typically, the thermal isolation structure includes one or more sensor signal flowpaths between the focal plane array and the associated substrate.

Some of the problems associated with previous thermal isolation structures include relatively high thermal conductivity associated with the electrical conductivity of the sensor signal flowpath between the focal plane array and the associated substrate. The present invention solves this problem by forming the interconnect for the sensor signal flowpath out of thermally insulating material, such as cermet or a semiconductive material. The material is preferably chosen to optimize pixel-substrate thermal isolation and mechanical integrity while providing adequate electrical conductivity for the associated sensor signal flowpath.

Another problem associated with previous thermal isolation structures is the thermal conductivity between the focal plane array and the substrate due to excess material used to form the thermal isolation structure. The present invention solves this problem by removing excess material from the thermal isolation structure using, for example, an anisotropic etch. The resulting thermal isolation structure generally includes only material that directly supports the sensor signal flowpath, thereby improving pixel-substrate thermal isolation.

The performance of thermal detection systems may also be improved by thermally isolating each thermal sensor from adjacent thermal sensors or pixels. In one embodiment, the present invention improves inter-pixel thermal isolation in the focal plane array by forming the common electrode from a thermally insulating material, such as a cermet or a semiconductive material. In another embodiment, portions of the focal plane array may be selectively reticulated to further improve inter-pixel thermal isolation.

The present invention applies to thermal detection systems where the thermal sensors may be coupled to a common electrode to provide a voltage. The voltage provided by the common electrode may be a negative, positive, or zero potential. The present invention may also be applied to thermal detection systems with folded pixel thermal sensors, where each thermal sensor has its own sensor signal and voltage coupling to the underlying substrate.

One embodiment of the present invention is shown in connection with the hybrid thermal detector 10 shown in FIG. 1. Some of the principal components of hybrid thermal detector 10 include focal plane array 20, thermal isolation structure 40, and integrated circuit substrate 60. Focal plane array 20 comprises a plurality of thermal sensors 30. The quantity and configuration of thermal sensors 30 depend on the desired N by M focal plane array. The various components of hybrid thermal detector 10 are preferably contained in a housing (not shown) in a vacuum environment.

Various types of semiconductor materials and substrates may be used with the present invention. U.S. Pat. No. 4,143,269 entitled "Ferroelectric Imaging System," issued to McCormack, et al. and assigned to Texas Instruments Incorporated, provides information concerning infrared detectors fabricated from pyroelectric materials and a silicon switching matrix or integrated circuit substrate. U.S. Pat. No. 5,047,644 entitled "Polyimide Thermal Isolation Mesa For A Thermal Imaging System," issued to Meissner, et al. and assigned to Texas Instruments Incorporated, discloses a thermal isolation structure having thermal isolation mesa-type structures formed from polyimide.

Hybrid thermal detector 10, as shown in FIG. 1, produces a thermal image in response to incident infrared radiation striking focal plane array 20. The principal components of focal plane array 20 include infrared absorber and common electrode assembly 22 coupled to a plurality of pyroelectric elements 32 to form a plurality of thermal sensors 30. In one specific embodiment, barium strontium titanate (BST) may be used to form pyroelectric elements 32. Also, materials in the lead titanate family including lead titanate (PT), lead lanthanum titanate (PLT), lead zirconium titanate (PZT), and lead lanthanum zirconium titanate (PZLT) may be used to form pyroelectric elements 32 for use with hybrid thermal detector 10.

Thermal sensor 30 typically comprises pyroelectric element 32 and a corresponding section of infrared absorber and common electrode assembly 22 coupled to pyroelectric element 32. Infrared absorber and common electrode assembly 22 further comprises infrared absorber layer 26 and common electrode 28. Thermal sensor 30 further comprises a sensor signal electrode 34 associated with each pyroelectric element 32. One side of pyroelectric element 32 may be coupled to infrared absorber and common electrode assembly 22 of focal plane array 20. Sensor signal electrode 34 is coupled to the opposite side of an associated pyroelectric element 32.

Thermal isolation structure 40 thermally insulates focal plane array 20 from integrated circuit substrate 60 and provides a sensor signal interface between thermal sensors 30 and integrated circuit substrate 60. Thermal isolation structure 40 also provides mechanical support during bonding of focal plane array 20 with integrated circuit substrate 60. The thermal image signal from thermal sensor 30 in focal plane array 20 is coupled to integrated circuit substrate 60 through mesa strip conductor 42 supported by a corresponding untrimmed mesa-type formation 44, shown in phantom lines. Thermal sensor 30 is preferably electrically coupled through mesa strip conductor 42 to a corresponding contact pad 62 on integrated circuit substrate 60. In one embodiment, mesa strip conductor extends from the top of untrimmed mesa-type formation 44 to contact pad 62 on integrated circuit substrate 60. Thermal isolation structure 40 of the present invention may be readily adaptable to any hybrid solid state system which will benefit from enhanced thermal isolation.

Bump-bonding material 46 is formed on top of each mesa strip conductor 42. Bump-bonding material 46 is selected to be compatible with bump-bonding material (not shown) on sensor signal electrode 34. Conventional bump-bonding procedures may be used to provide a conductive bond between sensor signal electrode 34 of thermal sensor 30 and mesa strip conductor 42, resulting in adequate sensor signal connections between thermal sensor 30 and contact pad 62. Indium bump-bonding techniques have been satisfactorily used to form metal bonds between focal plane array 20 and thermal isolation structure 40.

In operation, incident infrared radiation impinges on infrared absorber and common electrode assembly 22 and produces a temperature change in pyroelectric element 32, which changes its electrical polarization and capacitance. The representative thermal image signal appearing on sensor signal electrode 34 will depend upon the polarization and capacitance of pyroelectric element 32, which in turn is a function of the incident infrared radiation. The thermal image signal from thermal sensor 30 is coupled to contact pad 62 on integrated circuit substrate 60 through mesa strip conductor 42.

An important feature of the invention includes forming mesa strip conductor 42 from thermally insulating material which provides a high degree of pixel-substrate thermal isolation between focal plane array 20 and integrated circuit substrate 60. Previous thermal isolation structures often used titanium tungsten or other metal characterized by high electrical conductivity to form the signal interconnect. However, these metals also exhibit high thermal conductivity which degrades pixel-substrate thermal isolation. The present invention forms mesa strip conductor 42 from a cermet, a semiconductive material, or other material characterized by low thermal conductivity, improved mechanical strength, and adequate electrical conductivity.

In one embodiment, mesa strip conductor 42 may be formed from a cermet having approximately eighty percent chromium and twenty percent silicon monoxide. Depending upon the specific application, appropriate cermets may have a metal concentration by weight of about seventy percent to ninety percent and a corresponding ceramic concentration by weight of about thirty percent to ten percent.

For one application, the cermet used to form mesa strip conductor 42 will preferably have an electrical resistivity of 2,500 microhms-centimeter and a thermal conductivity of $1.1 \times 10^{-2}$ watts/centimeter/°C. A matrix of silicon monoxide and chromium is representative of the types of cermet which can provide these desired characteristics. By way of comparison, titanium tungsten exhibits a thermal conductivity of 0.09 watts/centimeter/°C. Thus, the use of thermally insulating cermets may result in a substantial improvement in pixel-substrate thermal isolation between focal plane array 20 and integrated circuit substrate 60.

In addition to various cermets, mesa strip conductor 42 may be formed from a semiconductive material. Semiconductive materials have been used as thin film resistors in previous thermal imaging applications, but the present invention uses semiconductive materials to form the interconnects. Some appropriate semiconductive materials include chromium oxides ($Cr_xO_y$), silicon oxides ($Si_xO_y$), tantalum nitrides ($Ta_xN_y$), tantalum oxides ($Ta_xO_y$), tantalum oxide nitrides ($Ta_xO_yN_z$), polysilicons, and other metal oxides and metal nitrides. The present invention contemplates using a wide variety of thermally insulating materials to form mesa strip conductor 42 with the desired characteristics of low thermal conductivity, adequate electrical conductivity, and improved strength.

Depending upon the type of thermally insulating material selected, mesa strip conductor 42 may be formed on untrimmed mesa-type formation 44 using reactive sputtering techniques or composite target sputtering. For one application of the present invention, sputtering with silicone and chromium in an oxygen environment may be used to form mesa strip conductor 42 with the desired characteristics. Composite target sputtering allows compositional control to achieve the desired stoichiometry of the resulting mesa strip conductor 42. Mesa strip conductor 42 may be formed from a single film of thermally insulating material. A single film approach simplifies the fabrication process and also provides easier optimization of the thermal, electrical, and structural properties of mesa strip conductor 42.

Common electrode 28 may also be formed from a thermally insulating material to provide adequate electrical conductivity for delivering a potential to each thermal sensor, while considerably improving inter-pixel thermal isolation. Common electrode 28 may be formed from the same thermally insulating materials and in the same manner mentioned above with reference to mesa strip conductor 42. The design choice for the thermally insulating material used to form common electrode 28 should consider its three primary purposes of: (1) supplying a common potential to thermal sensors 30; (2) possessing the proper opacity and high reflectivity to maximize absorption of infrared energy; and (3) acting as an etch stop during fabrication of focal plane array 20.

The configurations of untrimmed mesa-type formation 44 and mesa strip conductor 42 are design choices, largely dependent upon thermal isolation, structural rigidity, and sensor signal flowpath considerations. In one embodiment, untrimmed mesa-type formation 44 may be trimmed with an anisotropic etch using mesa strip conductor 42 and optionally bump-bonding material 46 as an etch mask. After removing excess mesa material, the resulting trimmed mesa-type formation 50 is substantially defined by the vertical projections of the mesa strip conductor 42 and optionally bump bonding material 46 on integrated circuit substrate 60. The present invention contemplates any method in addition to an anisotropic etch to remove excess mesa material.

Removing excess mesa material not directly underlying mesa strip conductor 42 and bump-bonding material 46 further improves pixel-substrate thermal isolation between focal plane array 20 and integrated circuit substrate 60. Trimmed mesa-type formation 50 contains a reduced amount of material to support mesa strip conductor 42 and bump-bonding material 46. Removal of excess material used to form mesa-type formation 44 results in trimmed mesa-type formation 50 with a concomitant improvement in pixel-substrate thermal isolation.

One design approach for forming mesa strip conductor 42 from a single film or layer of thermally insulating material specifies the minimum electrical conductivity requirements to transport a sensor signal from sensor signal electrode 34 through mesa strip conductor 42 to contact pad 62. Since thermal conductivity and electrical conductivity often are closely related, setting the minimum electrical conductivity of mesa strip conductor 42 in turn specifies an approximate pixel-substrate thermal isolation for a given material. Specifying the minimum electrical conductivity requirements also dictates the amount of thermally insulating material to be used in forming mesa strip conductor 42. The final step in the design approach maximizes structural support given generally the amount of thermally insulating material to be used for mesa strip conductor 42. The same design approach may be used to achieve the desired thermal, electrical, and structural properties of common electrode 28 formed from thermally insulating material.

Thermal isolation structure 40 may be fabricated using conventional photolithographic techniques. Fabrication methods using photosensitive polyimide to form untrimmed mesa-type formations 44 are described below. However, for some applications, non-photosensitive polyimide may be used. Fabrication using photosensitive polyimide is often preferred, because it generally requires fewer process steps.

The first step in forming thermal isolation structure 40 is to apply the polyimide (photosensitive or non-photosensitive) to integrated circuit substrate 60 by spinning integrated circuit substrate 60 to flow the polyimide to uniform thickness. For fabrication using photosensitive polyimide, the polyimide is then exposed using a mask that patterns the polyimide layer. The exposed polyimide is developed using an appropriate solvent, and the unexposed polyimide is removed leaving the patterned array of polyimide untrimmed mesa-type formations 44. Each untrimmed mesa-type formation 44 is preferably formed adjacent to a respective contact pad 62 on integrated circuit substrate 60. The desired sidewall configuration may be determined by appropriate exposure and development techniques. The assembly is then cured in an appropriate heat-curing process to stabilize and harden the untrimmed mesa-type formations 44. Untrimmed mesa-type formations 44 may be formed from other suitable materials in addition to polyimide.

Using conventional photolithography techniques, a layer or film of thermally insulating material for mesa strip conductor 42 may be placed over mesa-type formations 44. The thermally insulating material may be cermet, a semiconductive material, or any other suitable material. The desired characteristics of an appropriate material are low thermal conductivity, adequate electrical conductivity, improved structural strength, and compatibility with the fabrication processes. Portions of the thermally insulating layer may be removed using conventional organic etched chemistry to form mesa strip conductor 42 extending over at least a portion of untrimmed mesa-type formation 44. In one embodiment, mesa strip conductor 42 is patterned to extend from the top of mesa-type formation 44 to contact pad 62. The thickness and geometry of mesa strip conductor 42 depends on the thermally insulating material used and other design considerations described above.

Additional fabrication steps may be employed to deposit bump-bonding material 46 or electrically conductive epoxies (not shown) on the top of mesa strip conductor 42 as desired. These additional fabrication steps are accomplished conventionally, with conventional materials selected for the specific application of thermal isolation structure 40. In one embodiment, the process of forming thermal isolation structure 40 may include anisotropically etching untrimmed mesa-type formation 44 to remove excess material leaving trimmed mesa-type formation 50. The anisotropic etch may be, for example, an oxygen-based reactive ion etch (RIE) or a magnetically-enhanced reactive ion etch (MERIE).

The precise structural configuration, and associated fabrication method, of untrimmed mesa-type formation 44 and mesa strip conductor 42 are significantly dependent upon the application chosen for the resulting thermal isolation structure 40. Even within a particular application, such as the exemplary hybrid thermal detectors 10 and 110, numerous design choices will be routinely implemented by those skilled in the art.

FIG. 2 illustrates an alternative embodiment of hybrid thermal detector 10 where slots 70, 72, 74 are formed in selected layers of infrared absorber and common electrode assembly 22 to improve inter-pixel thermal isolation. FIG. 2 illustrates three different embodiments of slots 70, 72, 74 that may be formed in infrared absorber and common electrode assembly 22. It should be understood that the different embodiments of slots 70, 72, 74 on a single focal plane array 20 are merely illustrative, and that any specific hybrid thermal detector constructed in accordance with the present invention may use only one slot type or a combination of slot types. Furthermore, the configuration of slots 70, 72, 74 shown in FIG. 2 allow adjacent thermal sensors 30 to be electrically coupled through common electrode 28 at their corners. It should be understood that the present invention may include any configuration of slots 70, 72, 74 to achieve enhanced inter-pixel thermal isolation while providing adequate electrical coupling to deliver a potential to thermal sensor 30.

In one embodiment, slots 70 are formed through both infrared absorber layer 26 and common electrode 28. Slot 72 shows an alternative embodiment where only the infrared absorber layer 26 is removed to improve inter-pixel thermal isolation. Slot 74 shows another alternative embodiment where only the common electrode 28 is removed to improve inter-pixel thermal isolation. Although slots 70, 72, 74 are disposed intermediate thermal sensors 30, the present invention also contemplates slots in infrared absorber layer 26 formed around the entire periphery of thermal sensor 30.

FIG. 3 illustrates an alternative embodiment of the present invention in which hybrid thermal detector 110 comprises focal plane array 120, thermal isolation structure 140, and integrated circuit substrate 160. As previously noted for hybrid thermal detector 10, the various components of hybrid thermal detector 110 are preferably disposed in a vacuum environment.

Focal plane array 120 comprises a plurality of electrically isolated thermal sensors 130. Infrared absorber and common electrode assembly 22 of hybrid thermal detector 10 has been replaced by a plurality of individual, discrete infrared absorber and reflective plate assemblies 122. Each infrared absorber and reflective plate assembly 122 is associated with a corresponding pyroelectric element 132. By forming focal plane array 120 with discrete infrared absorber and reflective plate assemblies 122, thermal conduction between adjacent thermal sensors 130 is significantly reduced, which reduces MTF losses associated with hybrid thermal detector 110.

Thermal isolation structure 140 has been modified to provide two mesa strip conductors 142 and 144 that electrically couple thermal sensor 130 to contact pads 162 and 164. Untrimmed mesa-type formations 146 and 148, shown in phantom lines, support mesa strip conductors 142 and 144, respectively.

Each infrared absorber and reflective plate assembly 122 comprises infrared absorber layer 124 and reflective plate 126. A plurality of slots 128 are disposed around the entire periphery of each infrared absorber and reflective plate assembly 122 to electrically and physically isolate each assembly 122 from adjacent assemblies 122. Since infrared absorber and reflective plate assemblies 122 are not connected with each other, bias voltage ($V_B$) cannot be applied to each pyroelectric element 132 through common electrode 28 as described with reference to hybrid thermal detector 10. Reflective plate 126 supports infrared absorber layer 124 and reflects incident infrared radiation to increase interaction with infrared absorber layer 124. Reflective plate 126 is not used to provide bias voltage ($V_B$) to the pyroelectric transducer represented by pyroelectric element 132.

The pyroelectric transducer or capacitor associated with each thermal sensor 130 is defined in part by pyroelectric element 132, bias voltage electrode 134, and sensor signal electrode 136. Bias voltage electrode 134 and sensor signal electrode 136 are disposed on the same side of pyroelectric element 132 but separated from each other. Therefore, pyroelectric element 132 functions as a dielectric with respect to electrodes 134 and 136.

Integrated circuit substrate 160 preferably includes a plurality of contact pads 162 and 164. Mesa strip conductors 142 and 144 electrically couple contact pads 162 and 164 to electrodes 134 and 136, respectively. Mesa strip conductor 142 applies bias voltage ($V_B$) received from contact pad 162 to pyroelectric element 132 through bias voltage electrode 134. Bias voltage ($V_B$) may be a negative, positive, or zero potential. Mesa strip conductor 144 transports signal voltage ($V_S$) received from pyroelectric element 132 through sensor signal electrode 136 to contact pad 164 in integrated circuit substrate 160.

Thermal isolation structure 140 of hybrid thermal detector 110 is formed in a similar manner to thermal isolation structure 40 of hybrid thermal detector 10. Two sets of mesa strip conductors 142 and 144, contact pads 162 and 164, and electrodes 134 and 136 are provided to apply bias voltage ($V_B$) to and read signal voltage ($V_S$) from pyroelectric element 132. Focal plane array 120 may be joined to thermal isolation structure 140 using bump-bonding metal 137 and 138 located on mesa strip conductors 142 and 144, respectively, and bump-bonding metal (not shown) on electrodes 134 and 136.

Hybrid thermal detector 110 incorporates similar features of hybrid thermal detector 10 to improve pixel-substrate thermal isolation. An important feature of the invention includes forming mesa strip conductors 142 and 144 from thermally insulating material which provides a high degree of thermal isolation between the associated focal plane array 120 and integrated circuit substrate 160. As described above with reference to FIG. 1 mesa strip conductors 142 and 144 may be formed from a cermet, a semiconductive material, or other material characterized by low thermal conductivity, improved mechanical strength, and adequate electrical conductivity.

As discussed above, excess mesa material may be removed from untrimmed mesa-type formations 146 and 148 to improve pixel-substrate thermal isolation. In one embodiment, an anisotropic etch using mesa strip conductors 142 and 144 and optionally bump bonding material 137 and 138 as etch masks may be used to remove excess mesa material. The resulting trimmed mesa-type formations 150 and 152 are substantially defined by the vertical projections of mesa strip conductors 142 and 144 and optionally bump bonding material 137 and 138 on integrated circuit substrate 160.

Although the present invention has been described with several embodiments, various changes and modifications may be suggested to one skilled in the art, and it is intended that the present invention encompass such changes and modifications as fall within the scope of the appended claims.

What is claimed is:

1. A method of fabricating a hybrid thermal detector, comprising the steps of:

forming a focal plane array from at least three thermal sensors which provide a sensor signal output representative of thermal radiation incident to the focal plane array, each thermal sensor formed in part from an associated pyroelectric element;

providing a substrate with at least three signal contact pads for receiving the sensor signal output from the respective thermal sensors and at least three bias contact pads for applying bias inputs to the respective thermal sensors;

forming at least three pairs of mesa-type formations, wherein each pair has a first mesa-type formation projecting from the substrate adjacent to one of the signal contact pads and a second mesa-type formation projecting from the substrate adjacent to one of the bias contact pads;

forming at least three pairs of mesa strip conductors, each conductor formed from a single film of thermally insulating material, each mesa strip conductor extending from the top of an associated mesa-type formation to a corresponding contact pad; and coupling the focal plane array with the substrate using the mesa strip conductors.

2. The method of fabricating the detector as defined in claim 1, wherein the mesa strip conductors are formed in part by composite target sputtering.

3. The method of fabricating the detector as defined in claim 1, wherein the mesa strip conductors are formed in part by reactive sputtering.

4. The method of fabricating the detector as defined in claim 1, wherein the mesa strip conductors are formed from a semiconductive material.

5. The method of fabricating the detector as defined in claim 1, wherein the mesa-type formations are formed in part with polyimide material and the mesa strip conductors are formed from low thermal conductivity cermet.

6. The method of fabricating the detector as defined in claim 1, further comprising the steps of:

forming an infrared absorber layer sensitive to thermal radiation;

coupling one side of the pyroelectric elements associated with the thermal sensors with the infrared absorber layer; and coupling the opposite side of the pyroelectric elements with the mesa strip conductors, the mesa strip conductors providing a sensor signal flowpath to the signal contact pads and a bias input flowpath from the bias contact pads.

7. The method of fabricating the detector as defined in claim 6, further comprising the steps of:

forming at least three slots in the infrared absorber layer, the slots formed intermediate the thermal sensors to improve inter-pixel thermal isolation.

8. The method of fabricating the detector as defined in claim 6, further comprising the steps of:

forming slots in the infrared absorber layer, the slots disposed around the entire periphery of at least one thermal sensor, thereby improving the inter-pixel thermal isolation.

* * * * *